United States Patent

Ternullo, Jr. et al.

[11] Patent Number: 5,973,895
[45] Date of Patent: Oct. 26, 1999

[54] METHOD AND CIRCUIT FOR DISABLING A TWO-PHASE CHARGE PUMP

[75] Inventors: Luigi Ternullo, Jr.; Jeffrey S. Earl, both of San Jose, Calif.

[73] Assignee: Vanguard International Semiconductor Corp., Hsinchu, Taiwan

[21] Appl. No.: 09/056,546

[22] Filed: Apr. 7, 1998

[51] Int. Cl.[6] ............................ H02H 7/00; H02M 3/18
[52] U.S. Cl. ............................ 361/18; 361/86; 363/59
[58] Field of Search ........................ 361/18, 86, 91; 363/59, 60; 327/536

[56] References Cited

U.S. PATENT DOCUMENTS

| | | |
|---|---|---|
| 4,752,699 | 6/1988 | Cranford, Jr. et al. ............ 327/100 |
| 5,247,208 | 9/1993 | Nakayama . |
| 5,483,486 | 1/1996 | Javanifard et al. ............ 365/185.17 |
| 5,530,640 | 6/1996 | Hara et al. . |
| 5,587,956 | 12/1996 | Tanida . |
| 5,592,370 | 1/1997 | Rogers . |
| 5,808,883 | 9/1998 | Hawkes ............ 363/60 |
| 5,841,725 | 11/1998 | Kang et al. ............ 365/226 |

*Primary Examiner*—Michael J. Sherry
*Attorney, Agent, or Firm*—Christensen O'Connor Johnson & Kindness PLLC

[57] ABSTRACT

A circuit for disabling a two-phase charge pump includes a pump select circuit and a disable control circuit. The pump select circuit is configured to select one control signal from a plurality of control signals in response to at least one select signal. The selected signal is in effect provided to the disable control circuit, which also receives a pump disable signal. A voltage sensing circuit asserts the pump disable signal when the pumped voltage reaches a predetermined maximum level. While the pump disable signal is de-asserted, the disable control circuit in effect provides the selected signal to the two-phase charge pump as a pump control signal. However, when the pump disable signal is asserted, the disable control signal latches the current logic level of the pump control signal so that the pump control signal does not transition while the pump disable signal is asserted. As a result, the two-phase charge pump is prevented from performing an extra pump cycle that would cause the pumped voltage to exceed the predetermined maximum level.

22 Claims, 3 Drawing Sheets

METHOD AND CIRCUIT FOR DISABLING A TWO-PHASE CHARGE PUMP

FIELD OF THE INVENTION

The present invention relates to integrated circuits and, more particularly, to integrated circuit charge pumps. Still more particularly, the present invention relates to circuits for disabling a charge pump.

BACKGROUND

Some integrated circuits include a charge pump to generate a supply voltage "on-chip". Moreover, in some circuits the charge pump is used to generate a boosted voltage. As used herein, a boosted voltage is a voltage that is greater than the greatest "off-chip" supply voltage (e.g., the VCC supply voltage). For example, a boosted supply voltage can be used to turn on a N-channel field effect transistor (NFET) pull-up device in an output circuit. The boosted gate voltage allows the NFET to pull up the output voltage to essentially the full VCC supply voltage level when the output circuit is to generate a logic high output signal (instead of VCC−Vt as when the gate voltage is not boosted).

In this type of application, the boosted voltage is generally regulated to a value of about VCC+Vtn+Vm, where VCC is the value of the VCC supply voltage, Vtn is the value of the threshold voltage of the NFET and Vm is the value of additional noise margin. A voltage sensing circuit is typically used to monitor the boosted voltage and disable the charge pump when the boosted voltage reaches the value VCC+Vtn+Vm.

The charge pump may include a disable circuit that is configured to receive a control signal from the voltage sensing circuit to enable and disable the charge pump. FIG. 1 is a schematic diagram illustrative of such a disable circuit adapted for use in a memory chip. Disable circuit 10 includes AND gates 11 and 12, OR gate 13, NAND gate 14 and inverter 15. AND gate 11 is a two-input AND gate having its input leads connected to receive an oscillator (osc) signal and an oscillator select (oscsel) signal. The output lead of AND gate 11 is connected to an input lead of two-input OR gate 13. AND gate 12 is also a two-input AND gate, having its input leads connected to receive a row address strobe (ras) signal and a ras select (rassel) signal. The output lead of AND gate 12 is connected to the other input lead of OR gate 13.

NAND gate 14 is a two-input NAND gate having one input lead connected to receive a pump disable (PD) signal via input lead 17 and having the other input lead connected to the output lead 18 of OR gate 13. Typically, a voltage sensing circuit (not shown) monitors the boosted voltage and generates signal PD, which is configured to indicate whether the boosted voltage exceeds a predetermined maximum value. The output lead of NAND gate 14 is connected to an input lead of inverter 15. The output lead of inverter 15 is connected to an input lead 19 of a two-phase charge pump circuit (CPC) 16. Inverter 15 outputs a pump control (PC) signal that causes CPC 16 to "fire" or perform a pump cycle with every transition of signal PC to pump charge to increase the boosted voltage.

One of the problems with disable circuit 10 is that when signal PD is asserted to disable CPC 16, disable circuit 10 may generate an extra transition in signal PC, thereby causing the boosted voltage to exceed the predetermined maximum value. FIG. 2 is a timing diagram illustrating such an occurrence during the operation of disable circuit 10. Referring to FIGS. 1 and 2, the output signal generated by OR gate 13 is represented by a waveform 21. In this example, signal oscsel is at a logic high level, whereas signal rassel is at a logic low level. Consequently, AND gate 11 outputs to OR gate 13 a signal essentially equivalent to signal osc, while AND gate 12 outputs a logic low level to OR gate 13. As a result, OR gate 13 outputs a pre-pump control (PPC) signal that is substantially equivalent to signal osc from the ring oscillator (not shown).

As described above, signal PD is generated by the aforementioned voltage sensing circuit and is represented in FIG. 2 by a waveform 22. In this example, signal PD is an active low signal. Thus, when the boosted voltage exceeds the predetermined maximum value, signal PD transitions to a logic low level to initiate de-activation of CPC 16. Signal PC, generated by inverter 15, is represented by a waveform 23. When signal PD is de-asserted (i.e., logic high), NAND gate 14 functions essentially like an inverter to generate a signal equivalent to a complemented version of signal osc. Inverter 15 then complements the output signal from NAND gate 14 to generate signal PC as a slightly delayed version of signal osc. More particularly, a rising edge $24_1$ in waveform 21 causes a rising edge $24_2$ in waveform 23. Similarly, a falling edge $25_1$ in waveform 21 causes a falling edge $25_2$ in waveform 23.

However, when signal PD is asserted so that falling edge 26 in waveform 22 occurs while signal PCC is at a logic high level (indicated by portion 27 of waveform 21), the output signal generated by NAND gate 14 will transition from a logic low level to a logic high level signal. As a result, the falling edge of signal PD causes a high-to-low transition of signal PC as indicated by falling edge 28 of waveform 23. Thus, an extra transition undesirably occurs in signal PC after signal PD is asserted, thereby allowing CPC 16 to increase the boosted voltage beyond the predetermined maximum value. Accordingly, there is a need for a disable circuit for a two-phase charge pump that does not allow a transition of signal PC after signal PD is asserted.

SUMMARY

In accordance with the present invention, a circuit for disabling a two-phase charge pump is provided. In one aspect of the present invention, the two-phase charge pump is used to generate a boosted voltage. In this aspect of the present invention, the disable circuit includes a pump select circuit and a disable control circuit. The pump select circuit is configured to select one control signal from a plurality of control signals in response to at least one select signal. The selected signal is in effect provided to the disable control circuit, which also receives a pump disable signal.

The pump disable signal is asserted when the boosted voltage reaches a predetermined maximum level. While the pump disable signal is de-asserted, the disable control circuit in effect provides the selected signal to the two-phase charge pump as a pump control signal. However, when the pump disable signal is asserted, the disable control signal latches the current logic level of the pump control signal so that, unlike the aforementioned conventional disable circuit, the pump control signal does not transition while the pump disable signal is asserted. As a result, after the pump disable signal is asserted, the two-phase charge pump is prevented from performing an extra pump cycle that would cause the boosted voltage to exceed the predetermined maximum level.

DETAILED DESCRIPTION

Figure 3:
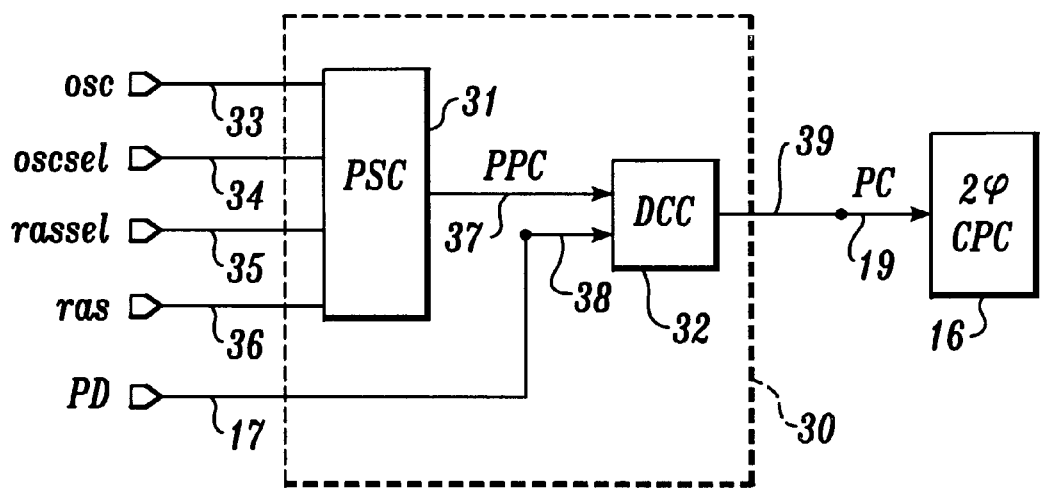
FIG. 3 is a functional block diagram illustrative of a disable circuit for a two-phase charge pump, according to one embodiment of the present invention.

FIG. 3 is a functional block diagram illustrative of a disable circuit 30 for a two-phase charge pump, according to one embodiment of the present invention. For clarity, the same reference numbers are generally used in different figures to indicate elements having the same or similar function or structure. In this embodiment, disable circuit 30 includes a pump select circuit (PSC) 31 and a disable control circuit (DCC) 32. PSC 31 is connected to receive signals osc, oscsel, rassel and ras through input leads 33–36, respectively. PSC 31 is connected to output signal PPC to DCC 32 through a lead 37. In addition, DCC 32 is connected to receive signal PD through a lead 38 and to output the signal PC onto a lead 39, which is connected to input lead 19 of CPC 16. In this embodiment, disable circuit 30 and CPC 16 are implemented in a memory chip for generating and regulating a boosted supply voltage used to boost word-lines.

In this embodiment, signal osc and signal oscsel are respectively generated by a ring oscillator (not shown) and a monitor voltage sensing circuit (not shown). The ring oscillator is configured to generate a periodic signal with a frequency of about 20 MHz to 33 MHz. The monitor voltage sensing circuit is configured to generate signal oscsel at a logic high level when the boosted voltage is below a predetermined monitor level and at a logic low level when the boosted voltage is at or beyond the monitor level. The monitor voltage sensing circuit can be any suitable voltage sensing circuit, which are well known in the art of integrated circuits. For example, the voltage sensing circuit can be of the type described in U.S. Patent Application "Regulator System For An On-Chip Supply Voltage Generator", filed Mar. 23, 1998, Ser. No. 09/046,408, assigned to the same assignee as the present invention and incorporated herein by reference.

Signal ras is generated by the memory chip's command decoding circuitry (not shown) in performing memory access operations. Such command decoding circuitry is well known in the art of memory chips. In this embodiment, signal rassel is essentially the inverse of signal oscsel so that signals oscsel and rassel are not asserted at the same time. Of course, in other embodiments, different schemes may be used to ensure that signals oscsel and rassel are not asserted at the same time. The ras and rassel signals are used in this embodiment to enable CPC 16 when the boosted voltage is at or above the monitor value because the memory chip uses a boosted word-line scheme. More particularly, during a memory access (indicated by the assertion of signal ras), CPC 16 is enabled to provide additional charge to the word-lines, which for this memory chip architecture must be at the boosted voltage level during memory access operations.

Signal PD is generated by a maximum voltage sensing circuit (not shown) configured to detect whether the boosted voltage generated by CPC 16 exceeds a predetermined maximum level. This maximum level is higher than the monitor level of the aforementioned monitor voltage sensing circuit. The maximum voltage sensing circuit can be any suitable voltage sensing circuit, which are well known in the art of integrated circuits.

Disable circuit 30 operates as follows. PSC 31 receives the signals osc, oscsel, rassel and ras through input leads 33–36. In response to the logic levels of signals oscsel and rassel, PSC 31 selects either signal osc or signal ras to output at lead 37 as signal PPC. More specifically, in this embodiment signal rassel is equivalent to a complemented version of signal oscsel. PSC 31 is configured so that when signal oscsel is at a logic high level, PSC 31 selects signal osc (i.e., propagates a signal equivalent to signal osc or a slightly delayed version thereof) to serve as signal PPC. Conversely, when signal oscsel is at a logic low level (i.e., signal rassel is at a logic high level), PSC 31 is configured to select signal ras to serve as signal PPC.

DCC 32 receives signal PPC from PSC 31 and signal PD from the aforementioned maximum voltage sensing circuit (not shown). In this embodiment, DCC 32 is configured to propagate, in effect, signal PCC to lead 39 in response to the logic level of signal PD. More specifically, when signal PD is at a logic high level, DCC 32 propagates a signal equivalent to signal PCC or a slightly delayed version thereof to lead 39 to serve as signal PC. In contrast, when signal PD transitions to a logic low level, DCC 32 is configured to latch the current logic level of signal PC at lead 39. Stated another way, DCC 32 is configured to prevent signal PC from transitioning after a high-to-low transition of signal PD. As a result, DCC 32 prevents CPC 16 from performing an extra pump cycle that would cause the boosted voltage to exceed the predetermined maximum level.

Table 1 below summarizes the voltage levels for one embodiment of the present invention adapted for use in a dynamic random access memory (DRAM) device. As is well known in the art of integrated circuits, these values are process and technology dependent.

TABLE 1

| | |
|---|---|
| Nominal VCC voltage level | 3.3 volts |
| Boosted voltage monitor level | 4.2–4.5 volts |
| Desired boosted voltage level during RAS cycles | 4.8–5.2 volts |
| Maximum boosted voltage level | 5.3–5.7 volts |

Figure 4:
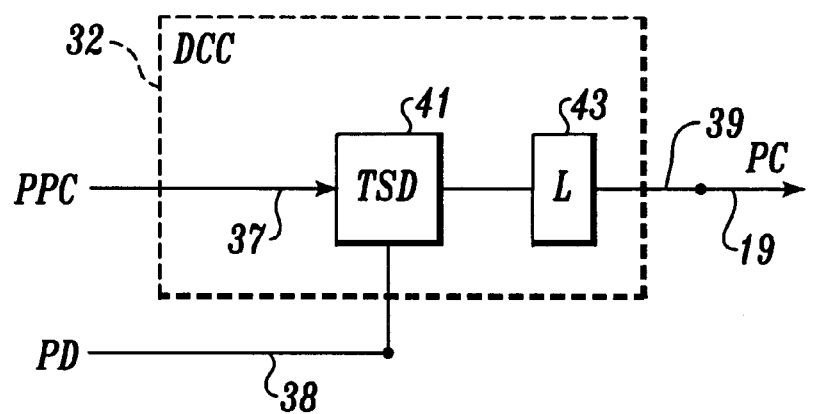
FIG. 4 is a functional block diagram illustrative of the disable control circuit depicted in FIG. 3, according to one embodiment of the present invention.

FIG. 4 is a functional block diagram illustrative of DCC 32 (FIG. 3), according to one embodiment of the present invention. In this embodiment, DCC 32 includes a conventional three-state driver (TSD) 41 and a conventional latch 43. The data input terminal of TSD 41 is connected to lead 37 to receive signal PPC. The enable/disable terminal of TSD 41 is connected to lead 38 to receive signal PD. The output lead of TSD 41 is connected to the input lead of latch 43. The output lead of latch 43 is connected to lead 39.

This embodiment of DCC 32 operates as follows. When signal PD is at a logic high level, TSD 41 is enabled and outputs signal PPC to latch 43 in the manner of a conventional TSD. Latch 43 then, in effect, latches the logic level of signal PPC to lead 39 to serve as signal PC.

When signal PD transitions to a logic low level, TSD 41 is disabled, entering a high impedance state. Latch 43 then operates to maintain the current logic level of signal PC at lead 39. Thus, signal PC does not transition after a high-to-low transition of signal PD, thereby preventing CPC 16 (FIG. 3) from performing an extra pump cycle that would cause the boosted voltage to exceed the predetermined maximum level.

Figure 1:
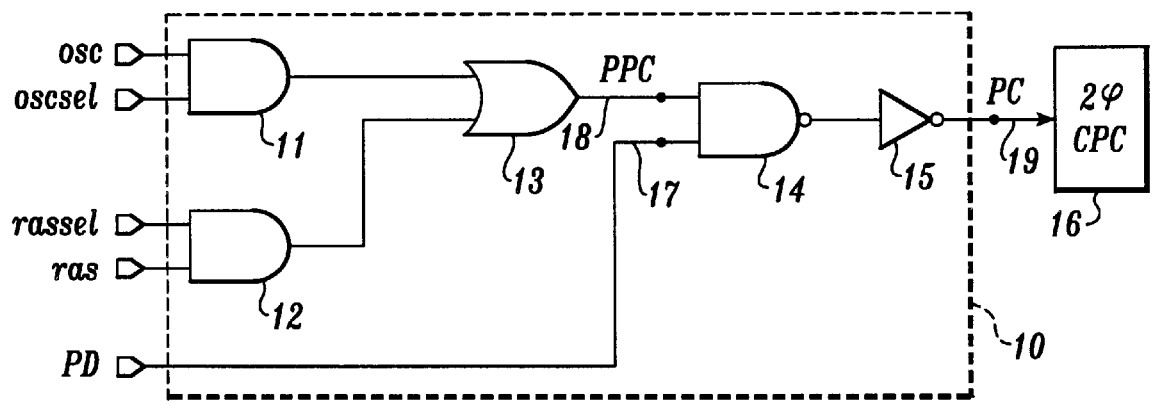
FIG. 1 is a schematic diagram illustrative of a conventional disable circuit for a two-phase charge pump.
Figure 2:
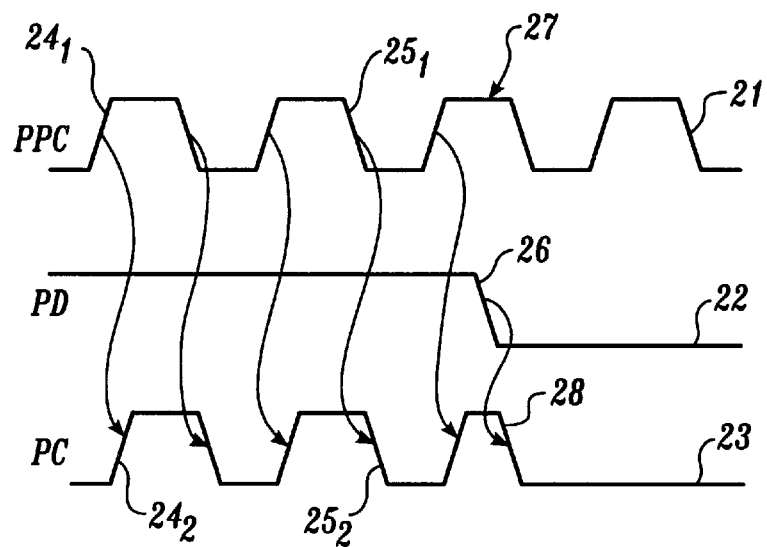
FIG. 2 is a timing diagram illustrative of the operation of the conventional disable circuit depicted in FIG. 1.
Figure 5:
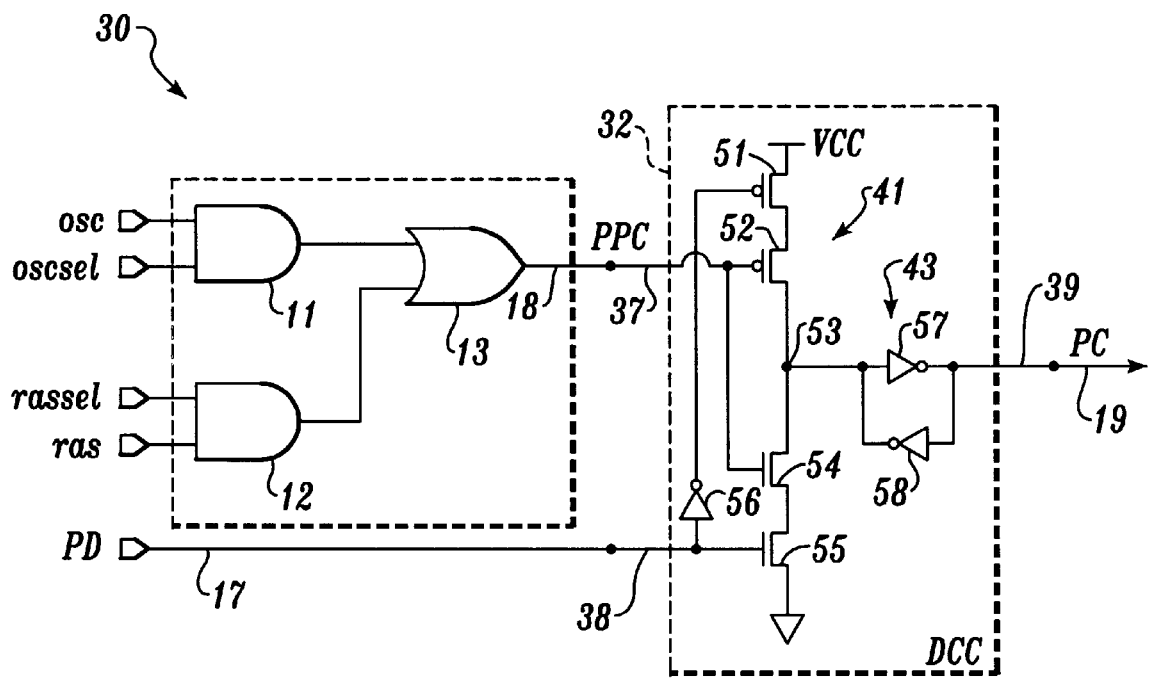
FIG. 5 is a schematic diagram illustrative of the disable circuit depicted in FIG. 3 combined with the disable control circuit depicted in FIG. 4, according to one embodiment of the present invention.

FIG. 5 is a schematic diagram illustrative of disable circuit 30 (FIG. 3) combined with DCC 32 (FIG. 4), according to one embodiment of the present invention. In this embodiment, PSC 31 includes AND gates 11 and 12 and OR gate 13. These logic gates are interconnected and operate essentially as described above in conjunction with FIG. 1. In this embodiment, output lead 18 of OR gate 13 is connected to lead 37 (FIG. 3), whereas input lead 17 is connected to lead 38 (FIG. 3). Of course, those skilled in the art of logic circuits can implement PSC 31 with different logic circuits (e.g., a two-input multiplexer) to select between signals osc and ras without undue experimentation. Further, additional AND gates may be used to gate additional control signals and an associated select signal. For example, in a memory circuit using boosted bit-switches, a third AND gate coupled to receive the column address strobe (cas) signal and a cas select (cassel) signal may be added, with OR gate 13 being replaced with a three-input OR gate.

TSD 41 is a conventional inverting TSD implemented with two P-channel field effect transistors (PFETs) 51 and 52 and two NFETs 54 and 55. In particular, PFETs 51 and 52 have their channel regions connected so as to form a conductive path between a VCC supply voltage bus and an internal node 53 when PFETs 51 and 52 are both turned on. Similarly, NFETs 54 and 55 have their channel regions connected so as to form a conductive path between internal node 53 and a ground bus when NFETs 54 and 55 are both turned on. In addition, the gates of PFET 52 and NFET 54 are connected to lead 37 to receive signal PPC. The gate of NFET 55 is connected lead 38 to receive signal PD, whereas the gate of PFET 51 is coupled to lead 38 through inverter 56 to receive the complement of signal PD.

Latch 43 is a conventional inverting latch implemented with two inverters 57 and 58 "back-to-front" (i.e., with the input lead of inverter 57 connected to the output lead of inverter 58 and vice versa) between internal node 53 and lead 39. Latch 43 operates in the conventional manner so that once TSD 41 drives the voltage at internal node 53 to a particular logic level, latch 43 operates to maintain that particular logic level at internal node 53 when TSD 41 enters the high impedance state.

Figure 6:
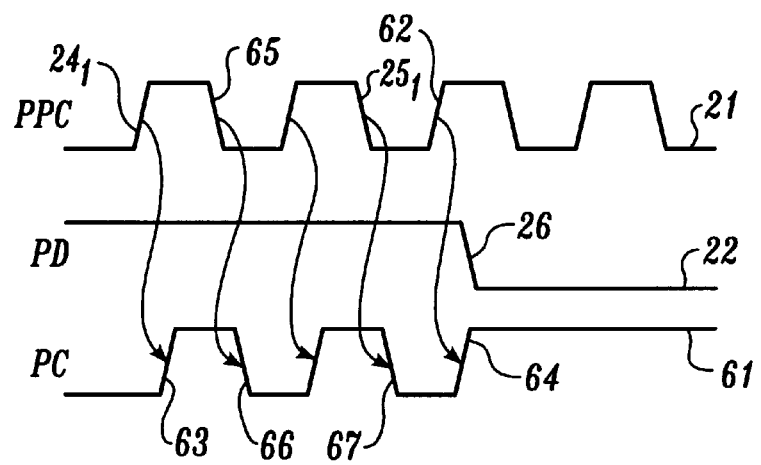
FIG. 6 is a timing diagram illustrative of the operation of the disable circuit depicted in FIG. 5, according to one embodiment of the present invention.

FIG. 6 is a timing diagram illustrative of the operation of disable circuit 30 (FIG. 5). Referring to FIGS. 5 and 6, this embodiment of disable circuit 30 operates as follows. PSC 31 operates to select either signal osc or signal ras. Because signal rassel is a complemented version of signal oscsel, when signal oscsel is at a logic high level, signal rassel is at a logic low level. Consequently, AND gate 11 outputs to OR gate 13 a signal essentially equivalent to signal osc, while AND gate 12 outputs a logic low level to OR gate 13. As a result, OR gate 13 outputs a pre-pump control (PPC) signal that is substantially equivalent to signal osc from a ring oscillator (not shown). Conversely, when signal oscsel is at a logic low level, AND gate 11 outputs a logic low level while AND gate 12 outputs a signal essentially equivalent to signal ras. Consequently, OR gate 13 outputs a signal substantially equivalent to signal ras to serve as signal PPC.

DCC 32 receives signal PPC from PSC 31 via lead 37. When signal PD is de-asserted (i.e., at a logic high level), NFET 55 and PFET 51 are turned on. As a result, PFET 52 and NFET 54 operates, in effect, as a conventional CMOS inverter having its input lead receiving signal PPC and having its output lead connected to the input lead of latch 43. The inverting action of TSD 41 combined with the inverting action of latch 43 causes DCC 31 to generate signal PC to be equivalent to a slightly delayed version of signal PPC. Thus, as shown in FIG. 6, while signal PD (represented by waveform 22) is at a logic high level, rising edges $24_1$ and 62 of waveform 21 (representing signal PPC) respectively cause rising edges 63 and 64 in waveform 61 (representing signal PC). Similarly, falling edges 65 and $25_1$ in waveform 21 respectively cause falling edges 66 and 67 in waveform 61.

However, when signal PD is asserted (i.e., transitions to a logic low level), PFET 51 and NFET 55 are turned off. Consequently, TSD 41 enters a high impedance state, with latch 43 maintaining the logic level that signal PC had at the time of the high-to-low transition of signal PD. As a result, unlike conventional disable circuit 10 (FIG. 1), falling edge 26 of waveform 22 does not result in a transition of signal PD even when falling edge 26 occurs while waveform 21 is at a logic high level. Accordingly, disable circuit 30 advantageously prevents CPC 16 (FIG. 3) from performing an extra pump cycle that would cause the boosted voltage to exceed the maximum level. It is appreciated that this scenario is most likely to occur when PSC 31 selects signal ras because the monitor voltage sensing circuit would normally cause signal oscsel to be at a logic low level before the maximum voltage sensing circuit asserts signal PD. Thus, waveform 21 is likely to represent a slightly delayed version of signal ras.

The embodiments of the two-phase charge pump disable circuit described above are illustrative of the principles of the present invention and are not intended to limit the invention to the particular embodiments described. For example, in light of the present disclosure, those skilled in the art of integrated circuit design can devise other implementations for use with different supply voltages, including negative supply voltages, without undue experimentation. In addition, those skilled in the art of logic circuits can implement equivalent logic for PSC 31 and DCC 32 adapted for use with select signals having polarities (i.e., being active high instead of active low or vice versa) that are different from the select signals (e.g., signals oscsel, rassel or PD) described. Accordingly, while the preferred embodiment of the invention has been illustrated and described, it will be appreciated that various changes can be made therein without departing from the spirit and scope of the invention.

We claim:

1. A circuit for disabling a charge pump circuit in response to a disable signal, the circuit comprising:
    a select circuit coupled to receive a plurality of control signals and at least one select signal, wherein the select circuit is configured to select one of the plurality of control signals as a function of the select signal; and
    a control circuit coupled to the select circuit and the charge pump circuit, wherein the control circuit is configured to output a pump control signal that is substantially equivalent to the signal selected by the select circuit when the disable signal is de-asserted and to prevent any transition of the pump control signal while the disable signal is asserted.

2. The circuit of claim 1 wherein the circuit is part of a two-phase charge pump.

3. The circuit of claim 1 wherein the control circuit comprises:
    a latch coupled to the charge pump circuit; and a three-state driver coupled to the select circuit and the latch, wherein the three-state driver is configured to enter a high-impedance state when the disable signal is asserted.

4. The circuit of claim 3 wherein the select circuit comprises a multiplexer.

5. The circuit of claim 3 wherein the select circuit comprises:

a first AND gate coupled to receive the select signal and further coupled to receive a first control signal of the plurality of control signals;

a second AND gate coupled to receive a second select signal and further coupled to receive a second control signal of the plurality of control signals; and an OR gate coupled to receive output signals from the first and second AND gates and to provide an output signal to the control circuit.

6. The circuit of claim 1, wherein the disable signal is asserted independently of the signal selected by the select circuit when a pumped voltage generated by the charge pump circuit reaches a predetermined level.

7. A method of disabling a charge pump circuit, the method comprising:

providing a pump control signal to the charge pump circuit;

receiving a disable signal, which is asserted when a pumped voltage generated by the charge pump circuit reaches a predetermined level; and controlling the pump control signal as a function of the disable signal so as to allow the pump control signal to transition from one logic state to another logic state while the disable signal is de-asserted and to prevent the pump control signal from transitioning from one logic state to another logic state while the disable signal is asserted.

8. The method of claim 7 wherein the charge pump circuit is part of a two-phase charge pump.

9. The method of claim 7 wherein a three-state driver and a latch are used in controlling the pump control signal.

10. The method of claim 9 wherein assertion of the disable signal causes the three-state driver to enter a high impedance state.

11. The method of claim 9 further comprising selecting a control signal from a plurality of control signals to serve as the pump control signal provided to the charge pump circuit.

12. The method of claim 11 wherein a multiplexer is used to select a control signal from the plurality of control signals.

13. The method of claim 11 wherein a plurality of AND gates and an OR gate are used to select a control signal from the plurality of control signals, each AND gate receiving different control signal and an associated select signal.

14. The method of claim 7, wherein the disable signal is asserted independently of other signals.

15. An apparatus for disabling a charge pump circuit, the apparatus comprising:

means for providing a pump control signal to the charge pump circuit;

means for receiving a disable signal, which is asserted when a pumped voltage generated by the charge pump circuit reaches a predetermined level; and means for controlling the pump control signal as a function of the disable signal so as to allow the pump control signal to transition from one logic state to another logic state while the disable signal is de-asserted and to prevent the pump control signal from transitioning from one logic state to another logic state while the disable signal is asserted.

16. The apparatus of claim 15 wherein the charge pump circuit is part of a two-phase charge pump.

17. The apparatus of claim 15 wherein the means for controlling comprises a three-state driver coupled to the means for receiving the disable signal and further comprising a latch coupled to the three-state driver and the charge pump circuit.

18. The apparatus of claim 17 wherein assertion of the disable signal causes the three-state driver to enter a high impedance state.

19. The apparatus of claim 17 further comprising means for selecting a control signal from a plurality of control signals to serve as the pump control signal provided to the charge pump circuit.

20. The apparatus of claim 19 wherein the means for selecting comprises a multiplexer.

21. The apparatus of claim 19 wherein the means for selecting comprises a plurality of AND gates and an OR gate, each AND gate being coupled to receive a corresponding control signal from the plurality of control signals and a corresponding select signal from a plurality of select signals.

22. The apparatus of claim 15, wherein the disable signal is asserted independently of other signals.

* * * * *